United States Patent [19]
Kanetomo et al.

[11] Patent Number: 4,956,043
[45] Date of Patent: Sep. 11, 1990

[54] DRY ETCHING APPARATUS

[75] Inventors: Masafumi Kanetomo, Suginami; Shinichi Tachi, Sayama; Kazunori Tsujimoto, Higashiyamato; Kiichiro Mukai, Hachioji; Takahiro Daikoku, Ushiku; Shigekazu Kieda, Niihari; Keijiro Shindo, Musashimurayama; Kenshiro Tamura, Hachioji, all of Japan

[73] Assignee: Hitachi, Ltd., Tokyo, Japan

[21] Appl. No.: 192,178

[22] Filed: May 10, 1988

[30] Foreign Application Priority Data

May 25, 1987 [JP] Japan .................................. 62-125809
Aug. 10, 1987 [JP] Japan .................................. 62-198080

[51] Int. Cl.$^5$ ...................... B44C 1/22; H01L 21/306; C03C 15/00
[52] U.S. Cl. ................................ 156/345; 204/298.31; 204/298.32; 204/298.33; 204/298.34; 204/298.38
[58] Field of Search ........... 156/345; 204/298, 192.12, 204/192.32, 298 E, 298 EG, 298 ET, 298 EP, 298 MW

[56] References Cited

U.S. PATENT DOCUMENTS

| 4,129,478 | 12/1978 | Racine et al. | 204/403 X |
| 4,264,393 | 4/1981 | Gorin et al. | 156/345 |
| 4,370,192 | 1/1983 | Cooley | 156/345 |
| 4,526,644 | 7/1985 | Fujiyama et al. | 156/345 |
| 4,565,601 | 1/1986 | Kakehi et al. | 156/345 X |
| 4,579,623 | 4/1986 | Suzuki et al. | 156/345 X |
| 4,615,755 | 10/1986 | Tracy et al. | 156/345 |
| 4,747,928 | 5/1988 | Takahashi et al. | 204/192.1 X |
| 4,756,815 | 7/1988 | Turner et al. | 204/192.12 X |

Primary Examiner—Nam X. Nguyen
Attorney, Agent, or Firm—Kenyon & Kenyon

[57] ABSTRACT

A dry etching apparatus is disclosed, in which the temperature of an article to be etched, placed on a wafer table, is controlled by a liquefied gas and a heater and the height of the surface of the liquefied gas can be varied arbitrarily. This apparatus enables the controlling of the temperature of the article to be done with a high accuracy over a wide range of low levels. Therefore, a low-temperature dry etching operation, which cannot otherwise be attained by a conventional apparatus of this kind, can be carried out.

22 Claims, 8 Drawing Sheets

DRY ETCHING APPARATUS

BACKGROUND OF THE INVENTION:

This invention relates to a dry etching apparatus, and more particularly to a dry etching apparatus suitably used for the anisotropic dry etching of a material and rarely causing a side etched portion to occur in the material.

Efficiently practicing the highly-accurate etching of a semiconductor substrate and various kinds of insulating films or various kinds of conductive films and semiconductor films constitute techniques essential to the manufacturing of VLSI, and various kinds of new techniques concerning anisotropic etching rarely causing undercuts to occur in an object material have been developed and studied. Regarding, especially, a method of or an apparatus for cooling an article to be etched on a wafer table, the techniques proposed by, for example, Japanese Patent Laid-Open No. 158627/1985 constitute examples of the conventional techniques of this kind.

According to the above conventional techniques, an article to be etched is cooled to a temperature of not higher than minus several tens of degrees centigrade by using a heat pipe as a cooling means, so as to prevent the occurrence of the side etching of the article. However, the range of controllable temperatures is narrow. In order to carry out an etching operation at a low temperature without trouble, it is, of course, necessary that an optimum temperature be selected in accordance with the purpose of the etching and the kind of an article to be etched. If the range of controllable temperatures is narrow, an optimum temperature cannot be selected, and it is difficult to carry out an etching operation excellently.

SUMMARY OF THE INVENTION:

An object of the present invention is to provide a dry etching apparatus capable of solving the abovementioned problem with the conventional dry etching techniques, cooling an article to be etched to a sufficiently low temperature, and controlling, with a high accuracy, the temperature of the article to be etched to a desired level within a sufficiently wide range (for example, 0° C. ~ −196° C.).

To achieve this object, the present invention provides a dry etching apparatus capable of controlling the temperature of a wafer table, on which an article to be etched is placed, over a wide range by regulating the level of a liquefied gas, for example, liquid nitrogen, while the wafer table is cooled with this liquefied gas and heated by a heater so as to bring the temperature of the wafer table to a predetermined level. If a means for reducing the contact thermal resistance between the article to be etched and wafer table is provided additionally, the controlling of the temperature of the article to be etched can be done in a superior manner.

In order to control the temperature of a work to a comparatively low level, for example, a level in the vicinity of −150° C., the liquid level of the liquefied gas is increased. Conversely, in order to control the temperature of a work to a compatatively high level, for example, a level of 0° C., the liquid level of the liquefied gas is decreased. If a means for reducing the contact thermal resistance between the wafer table and a work is provided additionally, the transfer of the heat from the wafer table to the work is promoted, so that the temperature can be regulated over a wide range.

DETAILED DESCRIPTION

Figure 1:
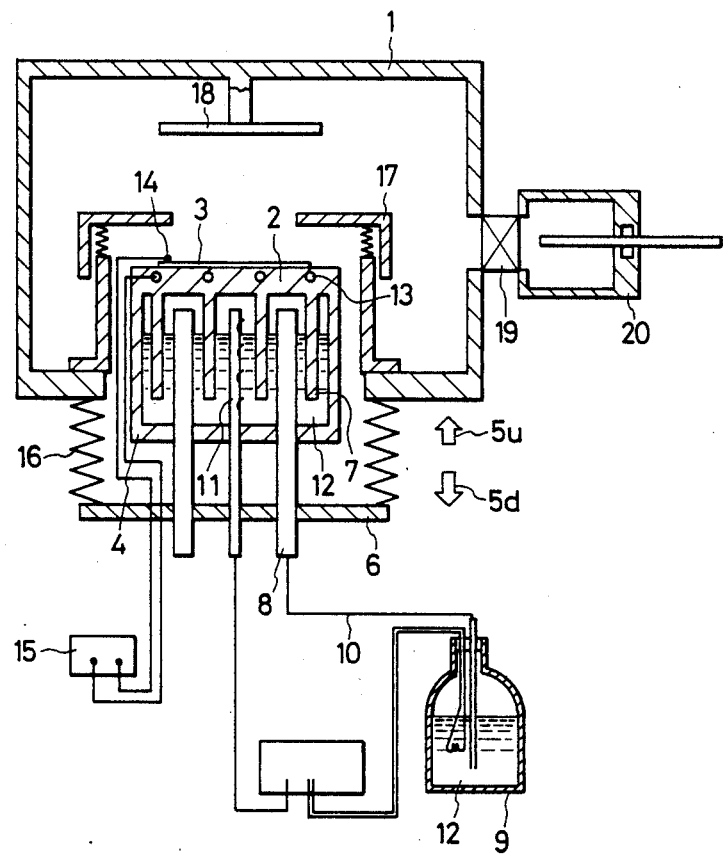
FIGS. 1 and 2 are schematic diagrams of an example of a low-temperature dry etching apparatus according to the present invention.

FIG. 1 shows an embodiment of the present invention. A liquefied gas container 4 set in a vacuum reaction chamber 1 is provided with a plurality of cooling fins of a high thermal conductivity, and a liquefied gas 12 is introduced from a liquefied gas supply means 9 into the liquefied gas container 4 via a supply hose 10 and a supply pipe 8. The liquefied gas container 4 is provided therein with a liquid level sensor 11. In accordance with a signal from this liquid level sensor 11, the liquefied gas 12 is supplied automatically into the liquefied gas container 4 to control the liquid level to a predetermined height. The liquefied gas container 4 is joined to a flange 6 which can be moved in the direction shown by arrows 5u, 5d. When the flange 6 is moved, the liquefied gas container 4 is also moved in the same direction. A heater 13 is provided in a wafer table 2, and the temperature of an article to be etched 3 is monitored by a thermocouple 14. A temperature regulator 15, which receives a signal from the thermocouple 14, is adapted to control the electric power of the heater 13 and maintain the temperature of the article 3 at a predetermined level.

Figure 2:
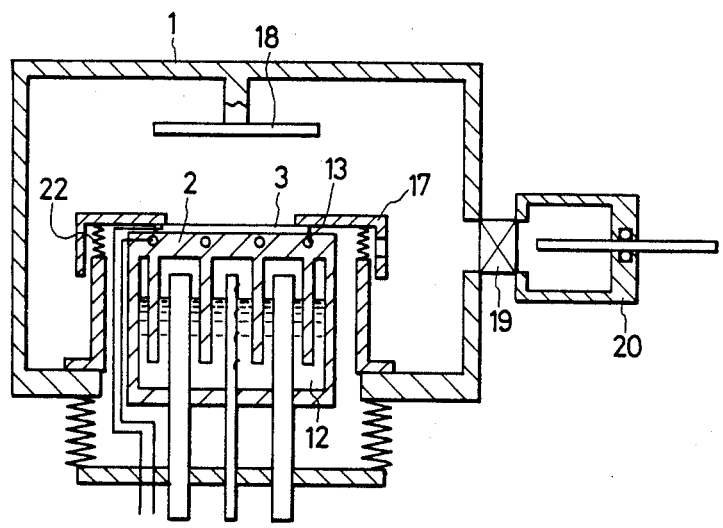

The flange 6 connected to the wafer table 2 is combined with the reaction chamber 1 via bellows 16. The flange 6 is moved in the direction of the arrow 5u when the etching is done. When the flange 6 is thus moved, the article to be etched 3 is pressed forcibly against a holding ring 17 as shown in FIG. 2, and the contact area of the article to be etched 3 and wafer table 2 increases. Consequently, the contact thermal resistance between the article 3 and wafer table 2 decreases to cause the thermal transfer effect to increase, so that the cooling capacity of the liquefied gas 12 and the heating capacity of the heater 13 with respect to the article to be etched 3 both increase. The etching is done by applying a high-frequency voltage between the wafer table 2 and an upper electrode 18.

A sample introducing chamber 20 is joined to a side surface of the reaction chamber 1 via a valve 19 so that the article to be etched 3 can be replaced without opening the reaction chamber 1 to the atmospheric air.

In FIGS. 1 and 2, the illustrations of known parts of a dry etching apparatus, such as the means for introducing and discharging a reaction gas into and from the reaction chamber 1, and a power source required to generate electric discharge of the gas in the reaction chamber 1 are omitted since these parts do not have direct relation to the description of the present invention. The same rule applies to the drawings of the other embodiments. Needless to say, the dry etching apparatus according to the present invention has these known parts. The liquefied gas referred to above consists of liquid nitrogen or liquid helium, and can be used selectively in a suitable manner in accordance with the purpose of the etching process to be carried out and the kind of the article to be etched.

Figure 3:
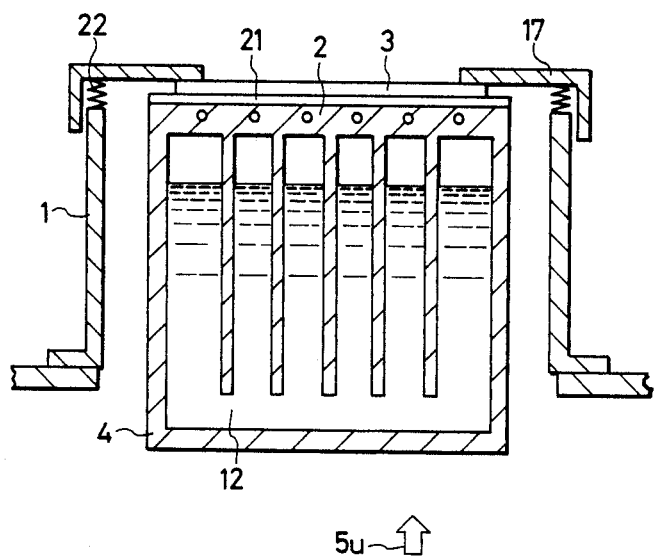
FIGS. 3 to 5 show different examples of wafer tables usable in the present invention.

FIG. 3 shows an example of a structure for improving the condition of thermal contact between the article to be etched 3 and wafer table 2. In the structure shown in this drawing, a thin, soft plate 21 is inserted between the wafer table 2 and article to be etched 3 so as to improve the condition of thermal contact therebetween (reduce the contact thermal resistance). This enables the temperature of the article to be etched 3 to be controlled with a high accuracy. The material for the thin, soft plate is preferably, for example, Teflon or silicone rubber, which can prevent extraneous matter from being mixed therein during an etching operation. The holding ring 17 is joined to the vacuum reaction 1 via a spring 22. When the liquefied gas container 4 is moved in the direction of the arrow 5u, the force applied to the article to be etched 3 via the holding ring 17 becomes large, so that the condition of contact between the article to be etched 3 and wafer table 2 is improved.

Figure 4:
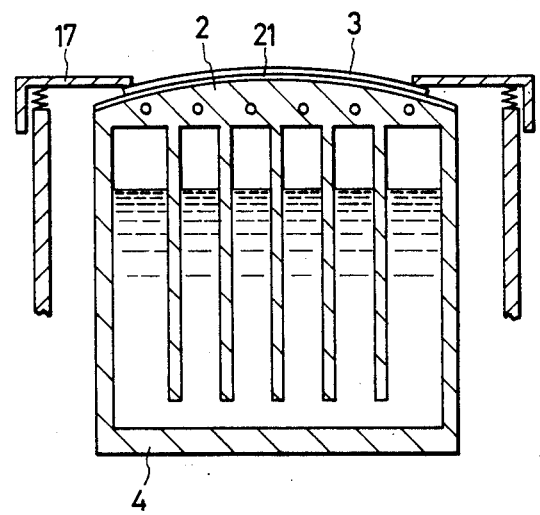

FIG. 4 shows another embodiment of a structure for improving the condition of thermal contact between the article to be etched and wafer table. In this example, the surface, on which the article to be etched is placed, of the wafer table 2 is formed in the shape of an upwardly projecting arc, and the article to be etched 3 is set on this surface with the thin, soft plate 21 inserted between the article 3 and wafer table 2. When the liquefied gas container 4 is moved in the direction of the arrow 5u to cause the holding ring 17 to contact and press the outer circumferential portion of the article 3, the article 3 is deformed arcuately and closely engages the wafer table 2. As a result, the condition of thermal contact between the article to be etched and wafer table 2 is improved (contact thermal resistance decreases), and the heat generated during an etching operation is transmitted efficiently from the article 3 to the liquefied gas, so that the temperature of the article 3 can be controlled with a high accuracy.

Figure 5:
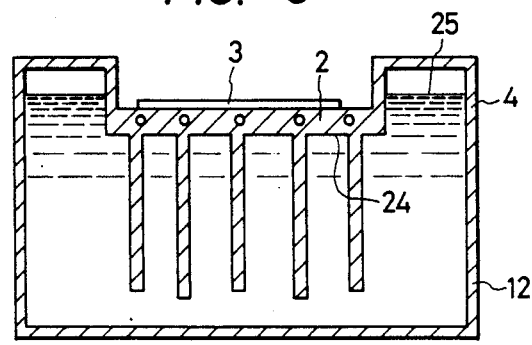

FIG. 5 shows another embodiment of the present invention. This example is suitable to be used to maintain the temperature of, especially, the article to be etched at an extremely low level, and it is formed so that the liquid level of the liquefied gas is higher than a lower surface 24 of the wafer table so as to enable this surface 24 to constantly contact the liquefied gas 12. Owing to this construction, the heat generated during an etching operation is transferred easily to the liquefied gas 12, and the article to be etched 3 can be maintained at a low temperature.

Figure 6:
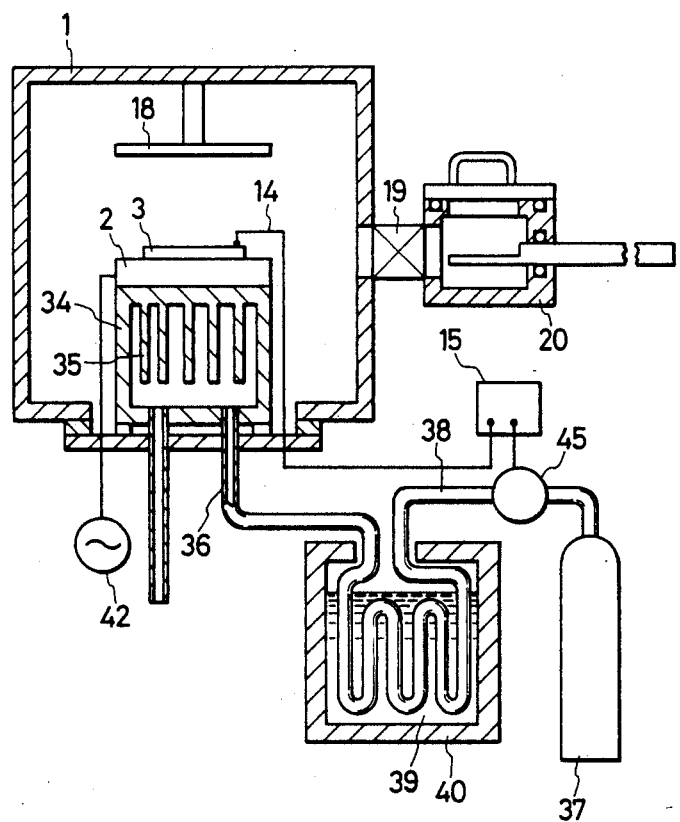
FIGS. 6 to 9 show different embodiments of the present invention.

FIG. 6 shows a further embodiment in which a low-temperature gas is used as means for cooling the article to be etched. The article to be etched 3 is placed on the wafer table 2 set in the reaction chamber 1, and a cooling block 34 is provided under the wafer table 2. A plurality of fins 35 are provided in the cooling block 34, and the low-temperature gas introduced from a pipe 36 takes the heat away from the article to be etched 3, to cool the same. The cooling gas (for example, a dry nitrogen gas) is stored in a cylinder 37. This cooling gas passes through a pipe 38 and a container 40, in which a liquefied gas 39 is held, to be cooled therein to a low temperature, the resultant gas being then introduced into the cooling block 34. After an etching gas has been introduced into the reaction chamber 1, a high-frequency voltage is applied between the upper electrode 18 and wafer table 2, and the etching is started. The temperature of the article 3 is measured with the thermocouple 14, and the temperature regulator 15 receives a signal representative of the results of this measurement. When the temperature of the article 3 increases as the etching thereof progresses, a valve 45 for regulating the flow rate of the low-temperature gas is opened in accordance with the above-mentioned signal from the thermocouple 14, so that the flow rate of the low-temperature gas increases to increase the cooling capacity of the cooling block 34 and maintain the temperature of the article 3 at a low level.

Figure 7:
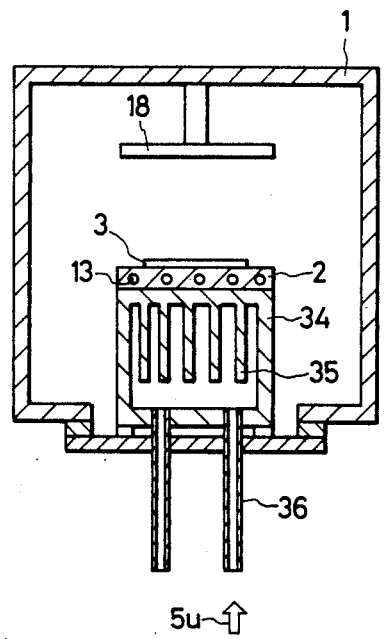

FIG. 7 shows a structure made by providing a heater 13 in the wafer table 2 shown in FIG. 6. The temperature of the wafer table 2 is controlled by varying the amperage of the heater 13 with the flow rate of the cooling gas kept constant.

Figure 8:
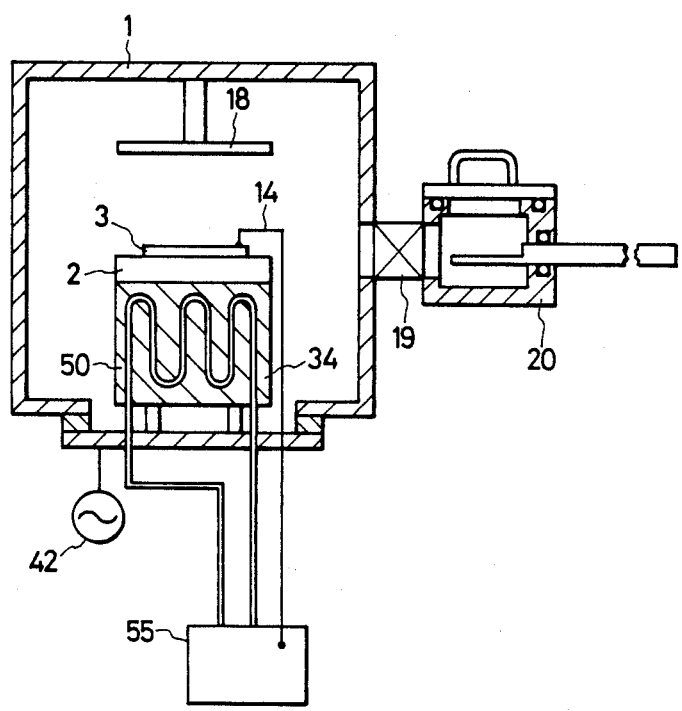

FIG. 8 shows a further embodiment of the present invention. A flow passage 50 for a cooling gas (for example, freon gas) sent from a refrigerating machine 55 is formed in the cooling block 34. In this flow passage 50, heat exchange is carried out between the cooling gas and the heat generated during an etching operation. The temperature of the article to be etched 3 is detected by the thermocouple 14. When heat is generated due to an etching operation, the refrigerating machine 55 is controlled in accordance with a signal from the thermocouple 14, which is disposed in contact with the surface of the article 3, and the cooling gas returns to the refrigerating machine 55 after it has been subjected to heat exchange in the cooling block 34, to be cooled therein. Accordingly, an increase of the temperature of the article 3 can be prevented, i.e., the temperature is maintained at a predetermined level.

Figure 9:
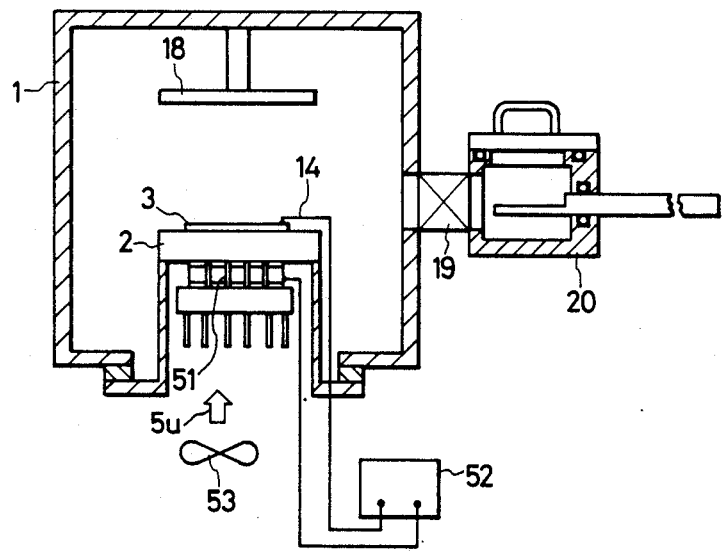

FIG. 9 shows an embodiment in which a Peltier element is used as a means for cooling the article to be etched 3. The Peltier element 51 is provided under the wafer table 2. If the amperage for driving the Peltier element 51 is varied, the endothermic capacity thereof can be varied, and, if the direction of the applied current is changed to positive and negative directions, both the heating and cooling operations can be carried out. The Peltier element is controlled by a controller 52 so that the temperature of the substrate 3 becomes constant. The temperature of the substrate 3 is measured with the thermocouple 14, a signal from which is an input of the controller 52 so as to control the Peltier element 51. A fan 53 is provided below the Peltier element 51 for the purpose of discharging the heat, which is absorbed from the article 3, to the atmospheric air, and it is adapted to send air in the direction of the arrow 5u. In this example, the article 3 consisting of a silicon wafer was etched to prove that the temperature of the article 3 could be controlled within the range of 20° C. to 120° C. with an accuracy of ±3° C.

Even when heat of 50 W is generated in the article 3 during an etching operation, the overshooting value with respect to a set level of the temperature of the article 3 was only around 5° C., and the temperature could be controlled to the original level in about 10 seconds. When the etching of an article consisting of a Si wafer was done, it was ascertained that the article could be etched with a high accuracy without causing many side-etched portions to occur.

According to the above examples, the temperature of the article being etched could be controlled within the range of 30° C. to 150° C. with an accuracy of within ±2° C. When the article was etched by controlling the temperature thereof to a comparatively high level of not lower than −50° C., the liquid level of the liquefied gas was lowered, so that the quantity of the liquefied gas used decreased. For example, when the input electric power of the heater was set to 100 W, the consumption of liquid nitrogen used as the liquefied gas was as low as about 30 cm$^3$/min.

In all of the above examples, the temperature of the article being etched was measured with a thermocouple. However, in the conventional temperature measuring techniques using a thermocouple, no consideration is given to the decrease in the measurement accuracy due to the junction of different kinds of metals, i.e. the lead wire for the thermocouple and the conductor for the low-pass filter. Therefore, it is difficult to measure the temperature of an article being dry etched, by these techniques with a high accuracy in a reaction container in which the superposition of high-frequency components occurs.

In another embodiment, the lead wire for the thermocouple, or the compensating lead therefor is made in a coiled state to form a coil for the low-pass filter.

A low-pass filter is formed by a coil, which consists of a temperature measuring conductor wound around a toroidal core, and a capacitor, and the high-frequency components are removed by this low-pass filter. Owing to the construction of the coil, a joint portion of different kinds of metals does not exist in the temperature measuring circuit, so that an abnormal voltage does not occur.

Figure 10:
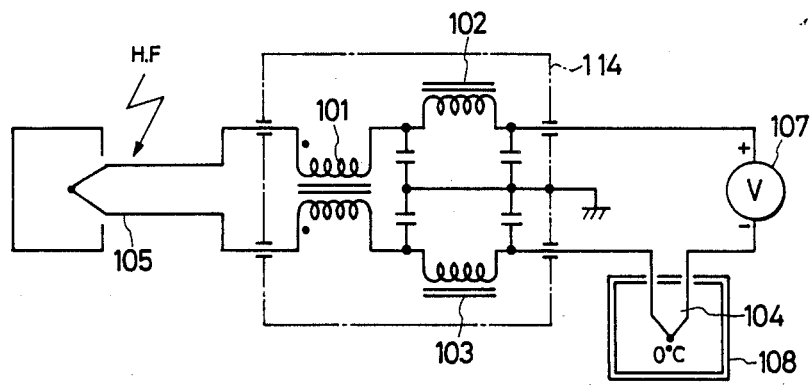
FIGS. 10 and 11 illustrate the temperature measuring methods used in the present invention and conventional techniques of this kind, respectively.

FIG. 10 shows an example of a measuring thermocouple 105 using alumel and chromel. The chromel wire in the measuring thermocouple 105 forms coils 101 (L1a), 102 in the low-pass filter and extends to a thermocouple 104 in a zero point compensator 108 through a temperature measuring instrument 107. The alumel wire in the measuring thermocouple 105 forms coils 101 (L1b), 3 and extends to the thermocouple 104 in the zero point compensator 108. In this temperature measuring circuit, an abnormal junction of different kinds of metals does not exist, so that no thermo-electromotive force occurs.

Figure 11:
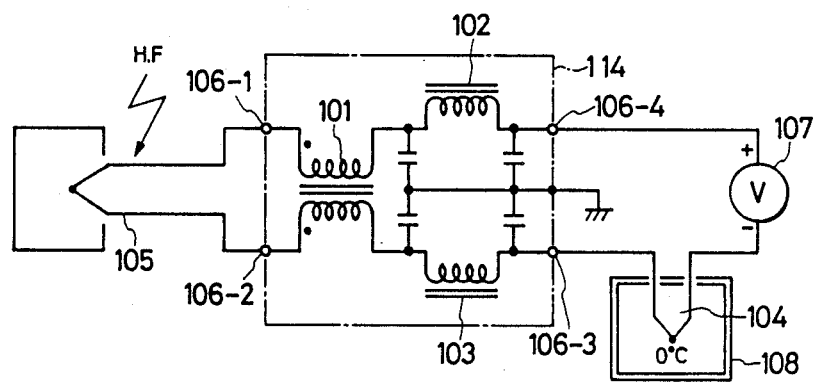

FIG. 11 shows a conventional temperature measuring circuit in which ready-made parts are used for the coils in the low-pass filter. Since the coils 101 to 103 consist of copper, the copper and chromel are connected at the nodes 106-1 and 106-4, and the copper and alumel at the nodes 106-2 and 106-3. Therefore, the thermo-electromotive force is generated to cause an error to occur in the temperature measuring instrument 107.

Figure 12:
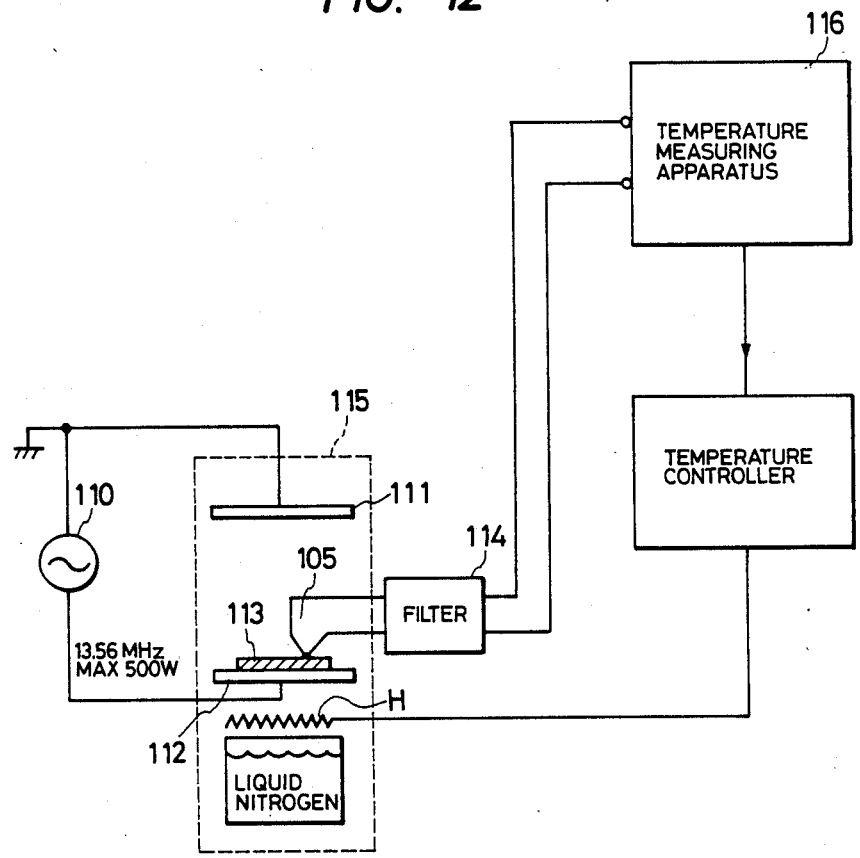
FIG. 12 shows an example of a method of measuring the temperature of an article to be etched in a low-temperature dry etching operation.

FIG. 12 shows an example of a cooling dry etching apparatus to which the techniques of the present invention applies. In this apparatus, the etching of an article 113, which is set in a reaction chamber 117 controlled to a predetermined constant temperature within the range of −100° C. to +250° C., is done by utilizing plasma generated by the high-frequency power applied from a high-frequency power source 110 to the electrodes 111, 112. In order to measure the temperature of the article 13, a thermocouple 105 is brought into contact with the upper surface thereof, and a filter 114 according to the present invention is provided in the vicinity of the lead-out portion of the reaction chamber 117 between the thermocouple 105 and a temperature measuring instrument 116. According to this embodiment, the high-frequency components superposed on a temperature signal normally generated in the thermocouple 105 are removed by the filter 114, and an abnormal voltage, which is ascribed to a joint portion of different kinds of metals in the circuit between the article 113 and temperature measuring instrument 116, does not occur, so that the measurement of the temperature of the article can be carried out stably and accurately.

According to the above embodiments, the following benefits can be obtained.

(1) The incoming noise induced to the temperature measuring detected signal system can be removed, and an accurate temperature measuring operation can be carried out.

(2) The circuit has passive parts only. It has simple construction, and can be manufactured easily.

(3) A temperature measuring system, which is inexpensive as compared with a temperature measuring system using a radiation thermometer, can be formed.

According to the present invention described in detail above, the temperature of an article being etched at a low temperature can be controlled to a predetermined level over a wide range with a high degree of accuracy. Therefore, the etching can be done at a temperature most suitable for the article being etched, an etching gas in use, and the etching purpose, and an excellent etching operation, which has not been experienced before, can be carried out in practice. In all of the above Examples, the present invention applies to a parallel plate type etching apparatus. Needless to say, the means for cooling an article being etched and a means for improving the thermal contact between the article and a wafer table, which are shown in these Examples, can also be used in the same manner even in a known microwave plasma etching apparatus. Accordingly, the present invention can apply in the same manner to not only a flat plate type etching apparatus but also a microwave etching apparatus.

What is claimed is:

1. A dry etching apparatus comprising:
    a reaction chamber;
    a means for introducing an etching gas into said reaction chamber,
    a means for discharging the gas from the interior of said reaction chamber to the outside thereof,
    a means for generating plasma of said etching gas in the interior of said reaction chamber,
    a wafer table on which an article to be etched is placed,
    a means for controlling the temperature of said article to a desired level, said means for controlling the temperature including means for cooling said article, said means for cooling being capable of cooling said article to at least as low as 0° C. and including a liquefied gas, said means for controlling the temperature further including means for heating said wafer table; and
    a means for regulating the height of said liquefied gas to a desired level in relation to said wafer table.

2. A dry etching apparatus according to claim 1, wherein said etching apparatus consists of a parallel plate type dry etching apparatus.

3. A dry etching apparatus according to claim 1, wherein said etching apparatus consists of a microwave plasma etching apparatus.

4. A dry etching apparatus according to claim 1, wherein a vessel holding said liquefied gas for cooling said article is provided below said wafer table.

5. A dry etching apparatus according to claim 4, wherein said liquefied gas vessel is provided therein with a sensor for use in controlling the height of the interface of said liquefied gas.

6. A dry etching apparatus according to claim 1, wherein said means for heating comprises a heater disposed in said wafer table.

7. A dry etching apparatus according to claim 1, wherein said etching apparatus includes a means for improving the thermal conductivity between said article to be etched and said wafer table.

8. A dry etching apparatus according to claim 7, wherein said thermal conductivity improving means is a means for bringing said article to be etched and said wafer table into close contact with each other by a spring.

9. A dry etching apparatus according to claim 8, wherein the upper surface of said wafer table is curved so as to project outward.

10. A dry etching apparatus according to claim 1, wherein said etching apparatus includes a thermocouple for measuring the temperature of said article, said thermocouple being connected to a temperature measuring instrument through a coil of a low-pass filter consisting of a lead wire or a compensating lead of said thermocouple.

11. The apparatus of claim 1 wherein said means for controlling temperature controls the temperature of said article in a range of 20° C. to −196° C.

12. A dry etching apparatus comprising:
a reaction chamber,
a means for introducing an etching gas into said reaction chamber,
a means for discharging the gas from the interior of said reaction chamber to the outside thereof,
a means for generating plasma of said etching gas in the interior of said reaction chamber,
a wafer table on which an article to be etched is placed, and a means for lowering the temperature of said article to a desired level, at least as low as 0° C., by circulating a low-temperature, liquefied gas in a cooling block provided under said wafer table.

13. A dry etching apparatus comprising:
a reaction chamber,
a means for introducing an etching gas into said reaction chamber,
a means for discharging the gas from the interior of said reaction chamber to the outside thereof,
a means for generating plasma of said etching gas in the interior of said reaction chamber,
a wafer table on which an article to be etched is placed, and
a means for controlling the temperature of said article to a desired level, at least as low as 0° C., by means of a Peltier element disposed beneath said wafer table.

14. A dry etching apparatus, comprising:
a reaction chamber;
a wafer table, disposed in said reaction chamber, wherein an article to be etched may be disposed on said table;
etching gas supply that supplies gas to the reaction chamber;
discharge outlet that removes gas from the reaction chamber;
plasma generator; container, disposed beneath said wafer table; liquefied gas disposed in said container; liquefied gas supply source, coupled to said container; a heating element disposed in the wafer table; and means for controlling a temperature of the article within a range of 20° C. to −196° C.

15. The apparatus of claim 14 further comprising:
means for reducing thermal resistance of the contact between said wafer table and an article.

16. A dry etching apparatus, comprising;
a reaction chamber;
a wafer table, disposed in said reaction chamber, wherein an article to be etched may be disposed on said table;
etching gas supply that supplies gas to the reaction chamber;
discharge outlet that removes gas from the reaction chamber;
plasma generator;
container, disposed beneath said wafer table;
liquefied gas disposed in said container;
liquefied gas supply source, coupled to said container;
a heating element disposed in the wafer table; and
means for controlling a temperature of the article within a range of 20° C. to −196° C.
wherein said means for controlling the temperature includes,
a liquid level sensor disposed in said container and detecting the level of the liquefied gas;
a thermo-couple for detecting a temperature of the article; and
a temperature regulator, responsive to the detected temperature, controlling the operation of the heating element in response to the temperature.

17. A dry etching apparatus, comprising:
a reaction chamber;
a wafer table, disposed in said reaction chamber, wherein an article to be etched may be disposed on said table;
etching gas supply that supplies gas to the reaction chamber;
discharge outlet that removes gas from the reaction chamber;
plasma generator;
container, disposed beneath said wafer table;
liquefied gas disposed in said container and cooling said wafer table;
liquefied gas supply source, coupled to said container;
a heating element disposed in the wafer table;
means for controlling a temperature of the article within a range of 20° C. to −196° C.;
a liquid level sensor disposed in said container and detecting the level of the liquefied gas;
a thermo-couple for detecting a temperature of the article;
a temperature regulator, responsive to the detected temperature, controlling the operation of the heating element in response to the temperature; and
means for reducing thermal resistance of the contact between said wafer table and an article.

18. The apparatus of claim 17 wherein said means for reducing thermal resistance comprises:
a plate disposed between said wafer table and the article; and
a holding ring for applying a force to the article to be etched.

19. A dry etching apparatus, comprising:
a reaction chamber;

a wafer table, disposed in said reaction chamber, wherein an article to be etched may be disposed on said table;

etching gas supply that supplies gas to the reaction chamber;

discharge outlet that removes gas from the reaction chamber;

plasma generator;

container, disposed beneath said wafer table;

liquefied gas disposed in said container and cooling said wafer table;

liquefied gas supply source, coupled to said container;

a heating element disposed in the wafer table;

means for controlling a temperature of the article within a range of 20° C. to −196° C.;

means for reducing thermal resistance of the contact between said wafer table and an article wherein said means for reducing thermal resistance comprises, a plate disposed between said wafer table and the article; and a holding ring for applying a force to the article to be etched.

20. A dry etching apparatus, comprising:

a reaction chamber;

a wafer table, disposed in said reaction chamber, wherein an article to be etched may be disposed on said table;

etching gas supply that supplies gas to the reaction chamber;

discharge outlet that removes gas from the reaction chamber;

plasma generator;

container, disposed beneath said wafer table;

liquefied gas disposed in said container and cooling said wafer table;

liquefied gas supply source, coupled to said container;

a heating element disposed in the wafer table;

means for controlling a temperature of the article within a range of 20° C. to −196° C.;

a liquid level sensor disposed in said container and detecting the level of the liquefied gas;

a thermo-couple for detecting a temperature of the article;

a temperature regulator, responsive to the detected temperature, controlling the operation of the heating element in response to the temperature;

means for reducing thermal resistance of the contact between said wafer table and an article;

wherein said means for reducing thermal resistance comprises said wafer table including an upwardly facing side for contact with the article and having an upwardly projecting arc shape.

21. A dry etching apparatus, comprising:

a reaction chamber;

a wafer table, disposed in said reaction chamber, wherein an article to be etched may be disposed on said table;

etching gas supply that supplies gas to the reaction chamber;

discharge outlet that removes gas from the reaction chamber;

plasma generator;

container, disposed beneath said wafer table;

liquefied gas disposed in said container and cooling said wafer table;

liquefied gas supply source, coupled to said container;

a heating element disposed in the wafer table;

means for controlling a temperature of the article within a range of 20° C. to −196° C.;

means for reducing thermal resistance of the contact between said wafer table and an article wherein said means for reducing thermal resistance comprises;

a plate disposed between said wafer table and the article;

a holding ring for applying a force to the article to be etched; and said wafer table including an upwardly facing side for contact with said plate and having an upwardly projecting arc shape;

a liquid level sensor disposed in said container and detecting the level of the liquefied gas;

a thermo-couple for detecting a temperature of the article; and a temperature regulator, responsive to the detected temperature, controlling the operation of the heating element in response to the temperature.

22. An apparatus for controlling a temperature of an article during an etching process; comprising:

a wafer table for supporting the article;

means, coupled to said wafer table to provide for cooling and heating said wafer table to control a temperature of the article to be between 20° C. and −196° C.;

a container disposed beneath said wafer table;

a liquefied gas disposed in said container for cooling said wafer table; and a heater disposed in said wafer table for regulating the temperature of the article.

* * * * *

UNITED STATES PATENT AND TRADEMARK OFFICE
CERTIFICATE OF CORRECTION

PATENT NO. : 4,956,043

DATED : 11 September 1990

INVENTOR(S) : Masafumi KANETOMO et al.

It is certified that error appears in the above-identified patent and that said Letters Patent is hereby corrected as shown below:

| Column | Line | |
|---|---|---|
| 1 | 46 | Change "C. $\sim$ -196° C.)." to --C. to -196° C.)--. |
| 3 | 46 | Delete "suitable". |
| 4 | 58 | Change "120°" to -- -120° --. |
| 6 | 14 | Delete "detected signal". |
| 8 | 1 | After "generator;" start new line. |
| 8 | 2 | After "table;" start new line. |
| 8 | 3 | After "tainer;" start new line. |
| 8 | 4 | After "container;" start new line. |
| 8 | 5 | After "and" start new line. |

Signed and Sealed this

Thirty-first Day of March, 1992

Attest:

HARRY F. MANBECK, JR.

*Attesting Officer*   *Commissioner of Patents and Trademarks*